(12) United States Patent
Liu et al.

(10) Patent No.: US 7,566,404 B2
(45) Date of Patent: Jul. 28, 2009

(54) METHOD OF FABRICATING A THIN FILM TRANSISTOR

(75) Inventors: Sai-Chang Liu, Kaohsiung County (TW); Cheng-Tzu Yang, Hsinchu County (TW); Chien-Wei Wu, Hsinchu County (TW); Shuo-Wei Liang, Taipei County (TW)

(73) Assignees: Taiwan TFT LCD Association, Hsinchu (TW); Chunghwa Picture Tubes, Ltd., Taoyuan (TW); Au Optronics Corporation, Hsinchu (TW); Hannstar Display Corporation, Tao-Yuan Hsien (TW); Chi Mei Optoelectronics Corporation, Tainan County (TW); Industrial Technology Research Institute, Hsinchu (TW); TPO Display Corp., Miao-Li County (TW)

( * ) Notice: Subject to any disclaimer, the term of this patent is extended or adjusted under 35 U.S.C. 154(b) by 0 days.

(21) Appl. No.: 11/670,424

(22) Filed: Feb. 2, 2007

(65) Prior Publication Data

US 2008/0067148 A1    Mar. 20, 2008

(30) Foreign Application Priority Data

Sep. 1, 2006    (TW) .............................. 95132305 A (51) Int. Cl.
*C03C 15/00* (2006.01)

(52) U.S. Cl. .......................... 216/13; 216/90; 216/100; 216/103; 216/105

(58) Field of Classification Search .................. 216/90, 216/100, 103, 105, 13
See application file for complete search history.

(56) References Cited

U.S. PATENT DOCUMENTS

| | | | |
|---|---|---|---|
| 5,296,239 A * | 3/1994 | Colery et al. ................ | 424/613 |
| 6,727,188 B2 | 4/2004 | Jo et al. | |
| 6,780,784 B2 * | 8/2004 | Jo et al. ....................... | 438/745 |
| 2003/0107023 A1 | 6/2003 | Chae et al. | |
| 2003/0178656 A1 | 9/2003 | Kwon et al. | |
| 2004/0118814 A1 | 6/2004 | Kim et al. | |
| 2004/0242000 A1 | 12/2004 | Jo et al. | |
| 2004/0262569 A1 | 12/2004 | Cho et al. | |
| 2005/0178742 A1 * | 8/2005 | Chelle et al. ................... | 216/88 |
| 2005/0224977 A1 * | 10/2005 | Yoshimura et al. .......... | 257/751 |

FOREIGN PATENT DOCUMENTS

CN    1417383    5/2003

* cited by examiner

*Primary Examiner*—Binh X Tran
(74) *Attorney, Agent, or Firm*—Jianq Chyun IP Office (57) ABSTRACT

An etchant for patterning composite layer containing copper is provided. The etchant includes peracetic acid being about 5% to 40% by weight and serving as a major component, a peracetic acid stabilizer being about 5% to 15% by weight, an organic acid being about 5% to 10% by weight, an inorganic acid being about 5% to 15% by weight, a salt being about 8% to 15% by weight, which are based on the total weight of the etchant.

7 Claims, 7 Drawing Sheets

METHOD OF FABRICATING A THIN FILM TRANSISTOR

CROSS-REFERENCE TO RELATED APPLICATION

This application claims the priority benefit of Taiwan application serial no. 95132305, filed on Sep. 1, 2006. All disclosure of the Taiwan application is incorporated herein by reference.

BACKGROUND OF THE INVENTION

1. Field of the Invention

The present invention relates to an etchant for patterning a composite layer and a method for fabricating a patterned conductive layer of an electronic device using the same.

2. Description of Related Art

As the thin film transistor liquid crystal display (TFT-LCD) panel gets larger in size, the metal wires having significantly higher resistivity will result in resistance-capacitance (RC) delay. Consequently, signals are being distorted during transmission and the panel display quality is thus affected. Using metal wires made of copper, which has a significantly lower resistivity, may effectively reduce the effects of RC delay. Nonetheless, the adhesion between copper and glass substrate is rather weak and copper diffuses easily. Therefore, other metal such as molybdenum is used to be the adhesion layer to strengthen the adhesion between the adhesion layer and the glass substrate, which also acts as a barrier layer to prevent diffusion.

However, etching a composite metal layer is not easy. Usually, more than two etchants are required to achieve the etching of a composite layer in multiple-etching steps. Nevertheless, this method is somewhat time-consuming. The Galvanic effect is easily resulted if a pure copper etchant used frequently in the traditional package industry or a PAN acid used by the panel industry is used to perform etching, which will also lead to etching undercut, and it will be harder to control the etch rate. Subsequently, a desirable etching cannot be obtained. Another etchant, as described in U.S. Pat. No. 6,780,784, primarily comprises of hydrogen peroxide ($H_2O_2$). Nonetheless, the concentration stability of a $H_2O_2$-based etchant cannot be easily controlled. Further, a highly concentrated $H_2O_2$-based etchant will cause damages to the components of the machines and result in potential occupational hazards. Hence, there is a need for an etchant that may be used to etch metal conductive lines in a composite layer.

SUMMARY OF THE INVENTION

The present invention is directed to an etchant for patterning composite layer and a method for fabricating patterned conductive layer of electronic device using the same to allow etching of the composite layer to be done in one single step and curtail the process time.

The present invention is directed to an etchant for patterning composite layer and a method for fabricating patterned conductive layer of electronic device using the same to eliminate the Galvanic effect resulted during the etching process.

The present invention is directed to an etchant having a concentration that may be effectively controlled for patterning composite layer and a method for fabricating patterned conductive layer of electronic device using the same.

The present invention is also directed to an etchant that will not cause damages to machines or pose occupational hazzards for patterning composite layer and a method for fabricating patterned conductive layer of electronic device using the same.

The present invention provides an etchant. The major component of this etchant is peracetic acid (PAA). The enchant further comprises a peracetic acid stabilizer, an organic acid, an inorganic acid, a salt and water. Peracetic acid is about 5% to 40% by weight, the peracetic acid stabilizer is about 5% to 15% by weight, the organic acid is about 5 to 10% by weight, the inorganic acid is about 5% to 15% by weight, and the salt is about 8% to 15% by weight, which are based on the total weight of the etchant.

The present invention provides a method for fabricating patterned conductive layer of electronic device. A conductive layer is formed on a substrate. The conductive layer may be a composite layer or a single metal layer. Thereafter, the conductive layer is selectively exposed to form an exposed portion and a non-exposed portion. Next, an etchant is used to remove the exposed portion and a part of the non-exposed portion so as to form a conductive line, wherein the etchant comprises peracetic acid, a peracetic acid stabilizer, an organic acid, an inorganic acid and a salt.

The etchant of the present invention may achieve the etching of a composite layer in one single step, curtailing the process time. Moreover, the concentration of the etchant may be effectively controlled to facilitate the precise formation of the desired shape, such as a trapezoid, on the composite layer so as to provide better step coverage when subsequent thin films are formed. In addition, using the etchant of the present invention eliminates the Galvanic effect, and will not cause damages to the machines or occupational hazards.

In order to the make the aforementioned and other objects, features and advantages of the present invention comprehensible, a preferred embodiment accompanied with figures are described in detail below.

DESCRIPTION OF EMBODIMENTS

The etchant of the present invention comprises peracetic acid, a peracetic acid stabilizer, an organic acid, an inorganic acid, a salt and water, which may be used to etch either a composite layer comprising two different metal layers in one single step or a single metal layer. The composite layer may be, for instance, a two-layered structure of first metal layer/second metal layer or a three-layered structure of second metal layer/first metal layer/second metal layer, wherein the first metal comprises copper or copper alloy, and the second metal comprises a material selected from the group consisting of molybdenum, silver, tantalum, titanium, chromium, nickel, tungsten, gold and an alloy comprising one or more of these materials. The single metal layer is a copper alloy layer, wherein the element in the copper alloy layer is selected from the group consisting of magnesium, silver, chromium, tungsten, molybdenum, niobium, nitrogen, silver, ruthenium, carbon and an alloy comprising one or more of these elements.

Peracetic acid is about 0.5% to 40% by weight based on the total weight of the etchant. Preferably, peracetic acid is about 5% to 39% by weight.

In one embodiment, the etchant is used to etch a structure containing copper and molybdenum, wherein the reaction mechanism for peracetic acid and copper is as follows:

$$CH_3COOOH + Cu = CuO + CH_3COOH$$

$$CuO + 2CH_3COOH = Cu(CH_3COO)_2 + H_2O$$

The reaction mechanism for peracetic acid and molybdenum is as follows:

The product, $MoO_3$, formed by reacting peracetic acid with molybdenum, is easily soluble in water.

The peracetic acid stabilizer is used to stabilize the peroxidized peracetic acid to prevent self-decomposition of the peracetic acid. Peracetic acid stabilizer is about 3% to 20% by weight based on the total weight of the etchant. Preferably, peracetic acid stabilizer is about 5% to 15% by weight. Peracetic acid stabilizer is, for instance, 1-Hydroxyethylidene-1,1-Diphosphonic Acid (HEDP), or 2,6-pyridinedicarboxylic acid.

The organic acid is used to assist in etching copper and molybdenum. The organic acid comprises a chemical selected from the group consisting of acetic acid, citric acid, oxalic acid, tartatic acid and a mixture comprising one or more of these chemicals. Preferable choice of the organic acid includes citric acid and acetic acid. Organic acid is about 2% to 15% by weight based on the total weight of the etchant. Preferably, the organic acid is about 5% to 10% by weight.

The inorganic acid may also be used to etch metals such as copper and molybdenum. The inorganic acids comprises a chemical selected from the group consisting of sulfuric acid ($H_2SO_4$), nitric acid ($HNO_3$), hydrochloric acid (HCl), phosphoric acid ($H_3PO_4$) and a mixture comprising one or more of these chemicals. The inorganic acid is about 2% to 20% by weight based on the total weight of the etchant. Preferably, inorganic acid is about 5% to 15% by weight.

The salt is used to control the pH value of the etchant, adjusting the relative etch ratio of copper to molybdenum. The salt comprises a chemical selected from the group consisting of halides, sulfates, iodates, phosphates, acetates and a mixture comprising one or more of these chemicals. Examples of halides include potassium chloride (KCl) and sodium chloride (NaCl). Examples of sulfates include potassium sulfates ($KHSO_4$). Examples of iodates include, $KIO_4$. Examples of phosphates include $(NH_4)HPO_4$. Examples of acetates include $CH_3COONH_4$, $CH_3COONa$, and $CH_3COOK$. Preferable choices of salt include KCl, NaCl, $KHSO_4$, $KIO_4$, $(NH_4)HPO_4$, $CH_3COONH_4$, $CH_3COONa$, $CH_3COOK$ and a mixture comprising one or more of these chemicals. The salt is about 5% to 20% by weight based on the total weight of the etchant. Preferably, the salt is about 8% to 15% by weight.

Water may be either pure water or deionized water. Water is about 10% to 80% by weight based on the total weight of the etchant. Preferably, water is about 15% to 75% by weight.

The etchant of the present invention may be used in etching a composite layer such as the metal conductive lines of TFT-LCD or that of plasma display panel. The following embodiments illustrate the etchant of the present invention used in TFT-LCD, which are exemplary, and the present invention is not limited thereto.

FIG. 1A through 1G are cross-sectional views illustrating the steps for fabricating a thin film transistor according to one embodiment of the present invention.

Figure 1A:
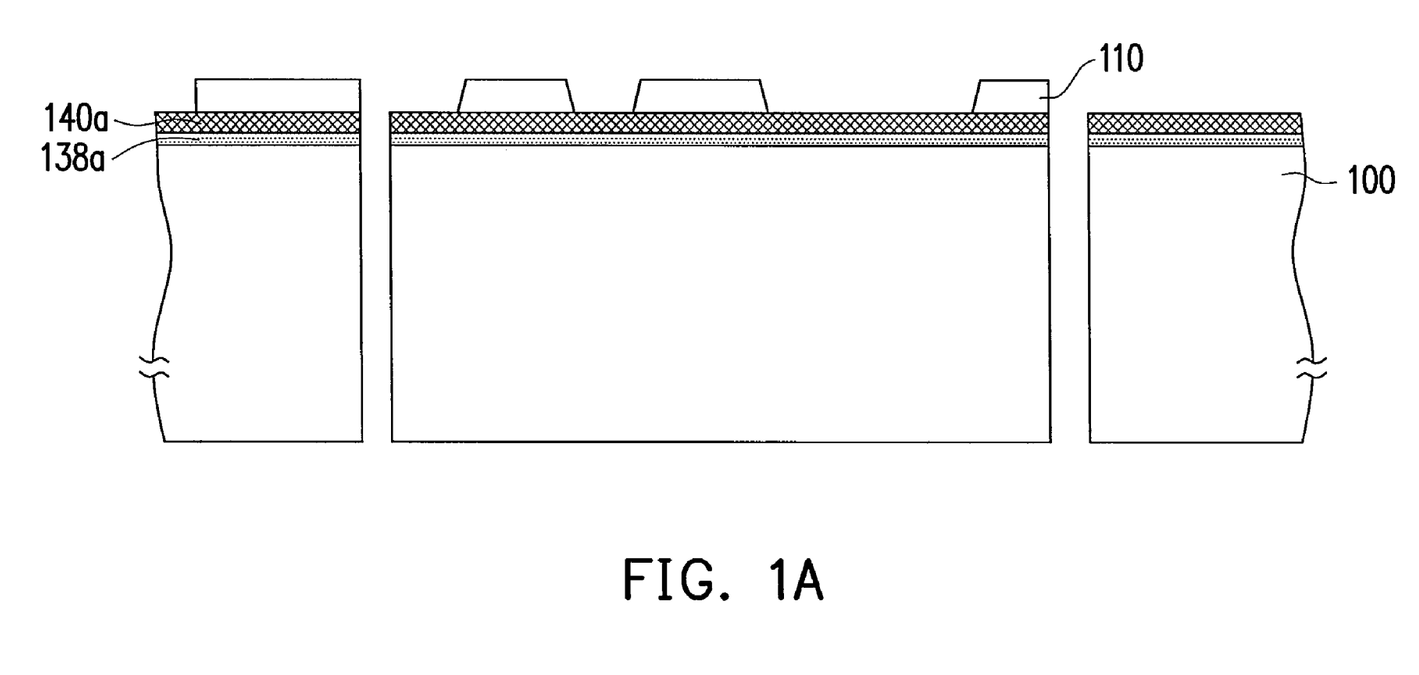
FIG. 1A through 1G are cross-sectional views illustrating the steps for fabricating a thin film transistor according to one embodiment of the present invention.

In FIG. 1A, a metal layer 138a and a metal layer 140a are formed on a substrate 100, thereafter a photresist layer 110 is formed. The metal layer 138a comprises a material selected from the group consisting of molybdenum, silver, aluminium, tantalum, titanium, chromium, nickel, tungsten, gold and an alloy comprising one or more of these materials. The metal layer 140a comprises copper or copper alloy, for example. The method for fabricating the metal layers 138a and 140a includes a sputtering process, an evaporation process, an electroplating process or an electroless plating process.

Figure 1B:
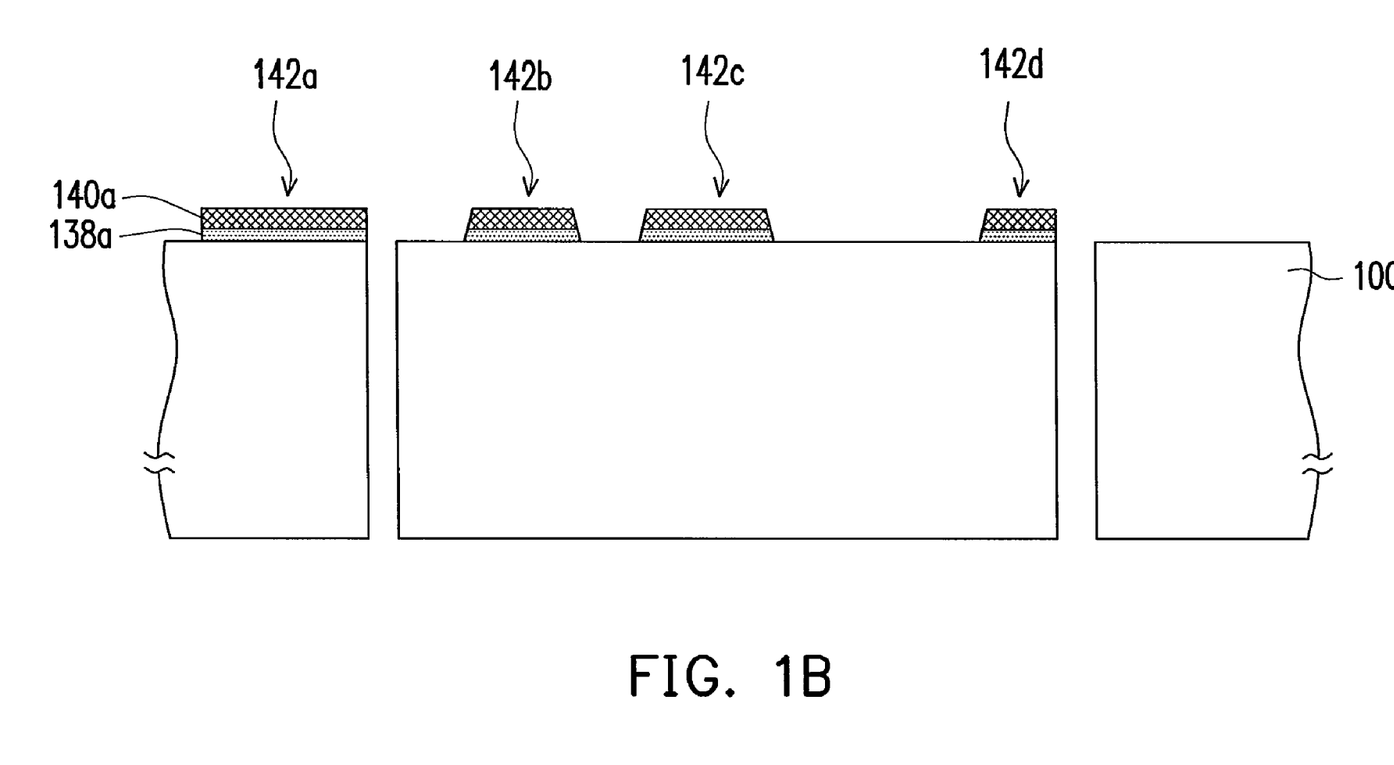

In FIG. 1B, the metal layers 138a and 140a exposed by the photoresist layer 110 and a portion of the metal layers 138a and 140a not covered by the photoresist layer 110 are etched with an etchant to form a terminal 142a of a scan line, a gate conductive layer 142b of a first gate, a gate conductive layer 142c of a second gate, and an electrode 142d of a capacitor. As shown in figure, after etching, these components take on taper profiles which improve the step coverage of the subsequently deposited layers. Thereafter, the photoresist layer 110 is removed. The etchant comprises peracetic acid, a peracetic acid stabilizer, an organic acid, an inorganic acid, a salt and water. Peracetic acid is about 5% to 40% by weight, the peracetic acid stabilizer is about 5% to 15% by weight, the organic acid is about 5% to 10% by weight, the inorganic acid is about 5% to 15% by weight, the salt is about 8% to 15% by weight, which are based on the total weight of the etchant. The organic acid comprises a chemical selected from the group consisting of acetic acid, citric acid, oxalic acid, tartaric acid and a mixture comprising one or more of these chemicals. The inorganic acid comprises a chemical selected from the group consisting of sulfuric acid ($H_2SO_4$), nitric acid ($HNO_3$), hydrochloric acid (HCl), phosphoric acid ($H_3PO_4$) and a mixture comprising one or more of these chemicals. The salt comprises a chemical selected from the group consisting of KCl, NaCl, $KHSO_4$, $KIO_4$, $(NH_4)HPO_4$, $CH_3COONH_4$, $CH_3COONa$, $CH_3COOK$ and a mixture comprising one or more of these chemicals.

Figure 1C:
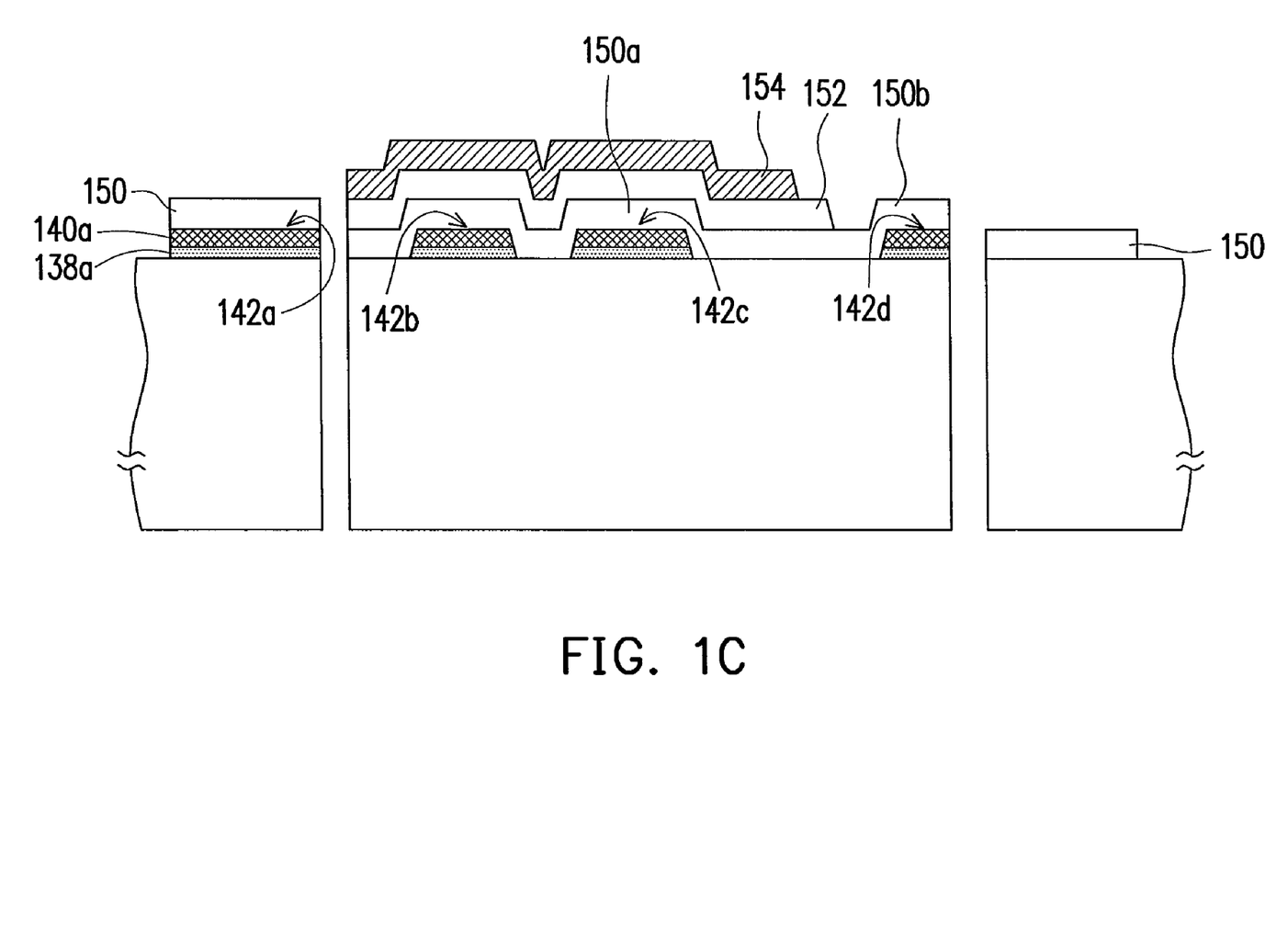

Thereafter, in FIG. 1C, a dielectric layer 150 is formed over the substrate 100. The dielectric layer 150 covering the gate conductive layer 142b of the first gate and the gate conductive layer 142c of the second gate is used as a gate dielectric layer 150a, and the dielectric layer 150 covering the electrode 142d is used as a dielectric layer 150b of the storage capacitor. The material of the dielectric layer 150 comprises $SiO_2$ and $Ta_2O_5$, for example. The method for forming the dielectric layer 150 includes a chemical vapor deposition process. Next, a patterned channel layer 152 and a patterned ohmic contact layer 154 are formed on the dielectric layer 150. The material of the channel layer 152 comprises amorphous silicon and the material of the ohmic contact layer 154 comprises n-type doped polysilicon, for example.

Figure 1D:
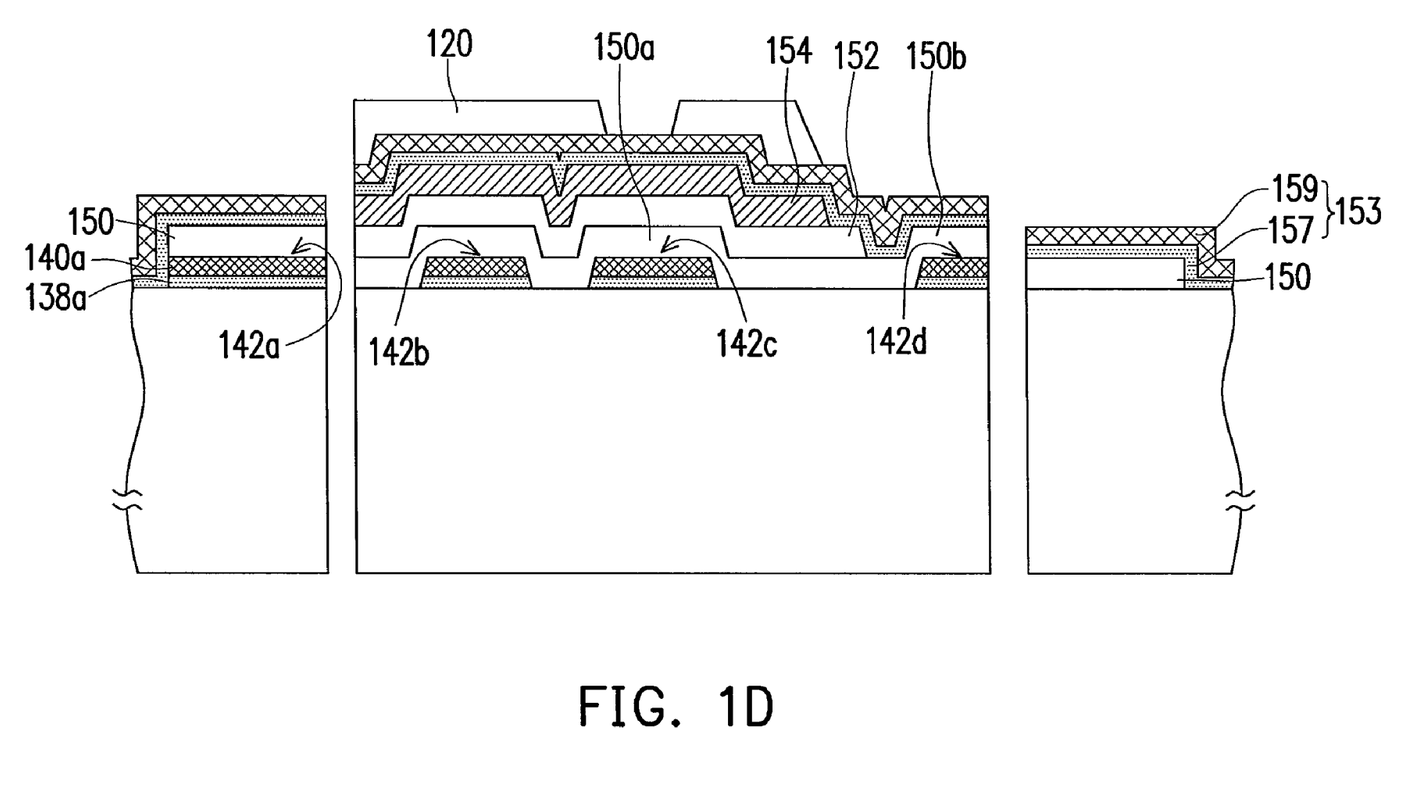

Thereafter, in FIG. 1D, a metal layer 153 is formed over the substrate 100. The metal layer 153 comprises a metal layer 157 and a metal layer 159. The metal layer 157 comprises a material such as molybdenum, tantalum, titanium, chromium and an alloy comprising one or more of these materials. The material of the metal layer 159 comprises copper or copper alloy. The method for fabricating the metal layers 157 and 159 includes a sputtering process, an evaporation process, an electroplating process or an electroless plating process. Next, a photoresist layer 120 is formed on the metal layer 153.

Figure 1E:
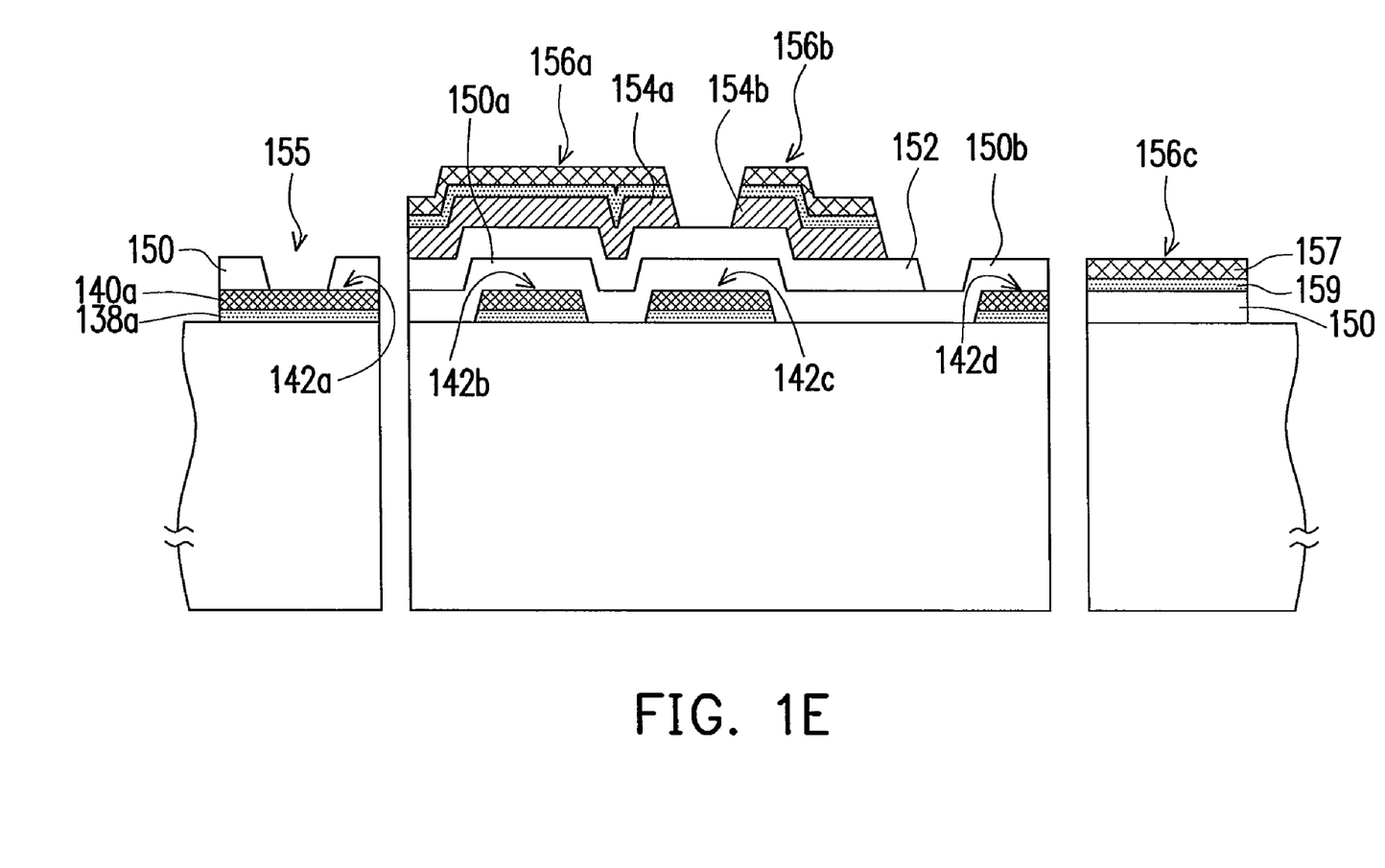

In FIG. 1E, a portion of the metal layers 157 and 159 exposed by the photoresist layer 120 and a portion of the metal layers 157 and 159 covered by the photoresist layer 120 are etched with an etchant. The patterned metal layers 157 and 159 are used as a source 156a, a drain 156b and a data line terminal 156c. The etchant comprises peracetic acid, a peracetic acid stabilizer, an organic acid, an inorganic acid, and a salt. Peracetic acid is about 5% to 40% by weight, the peracetic acid stabilizer is about 5% to 15% by weight, the organic acid is about 5% to 10% by weight, the inorganic acid is about 5% to 15% by weight, the salt is about 8% to 15% by weight, which are based on the total weight of the etchant. The organic acid comprises a chemical selected from the group consisting of acetic acid, citric acid, oxalic acid, tartatic acid and a mixture comprising one or more of these chemicals. The inorganic acid comprises a chemical selected from the group consisting of sulfuric acid ($H_2SO_4$), nitric acid ($HNO_3$), hydrochloric acid (HCl), phosphoric acid ($H_3PO_4$) and a mixture comprising one or more of these chemicals. The salt comprises a chemical selected from the group consisting of KCl, NaCl, KHSO$_4$, KIO$_4$, (NH$_4$)HPO$_4$, CH$_3$COONH$_4$, CH$_3$COONa, CH$_3$COOK and a mixture comprising one or more of these chemicals.

Then, the underlying ohmic contact layer 154 is patterned again to form ohmic contact layers 154a and 154b. Next, the photoresist layer 120 is removed. Thereafter, through another photolithographic and etching process, the dielectric layer 150 formed on the scan line terminal 142a is patterned again to form an opening 155.

Figure 1F:
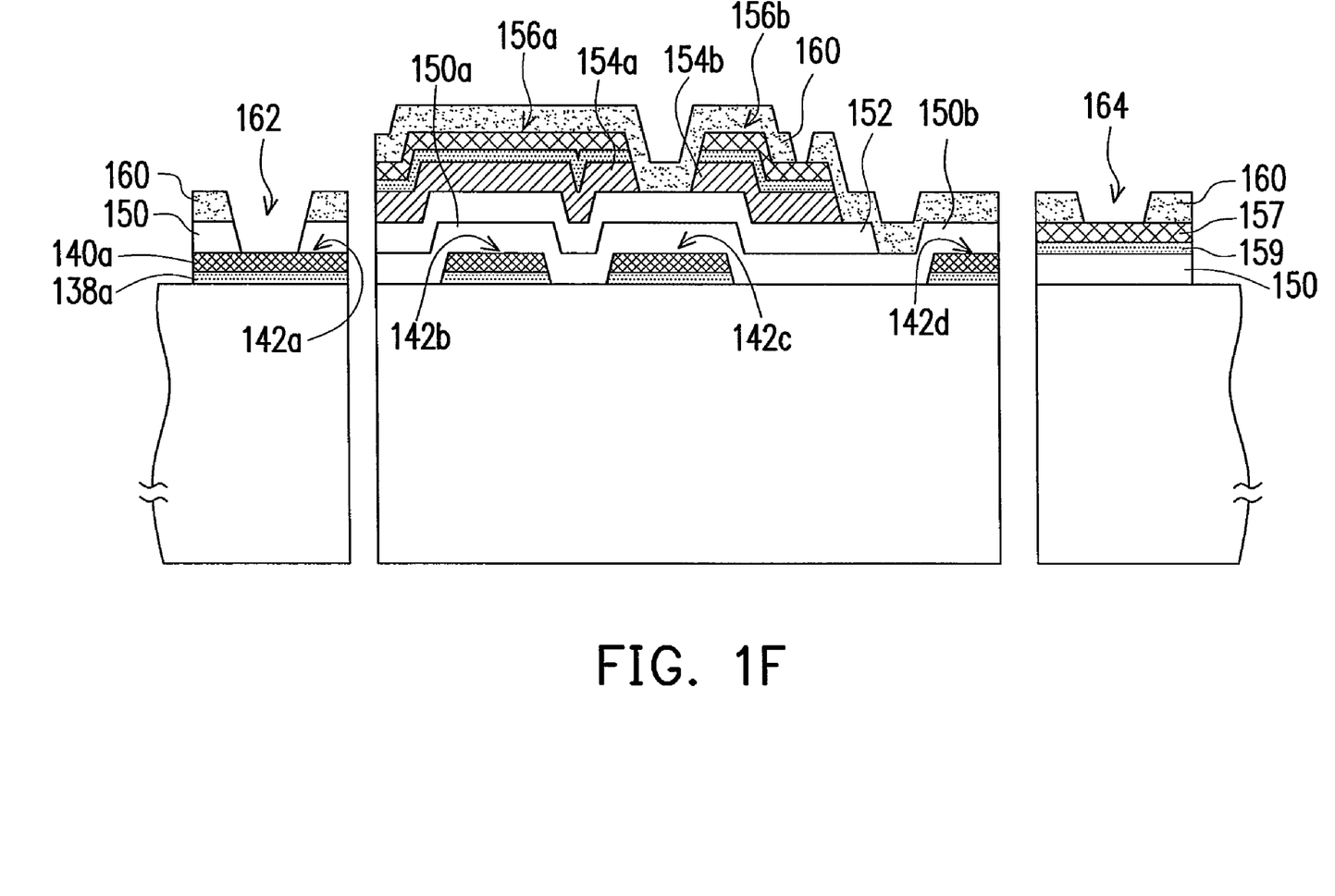

Next, in FIG. 1F, a passivation layer 160 is formed over the substrate 100, subsequently the passivation layer 160 is patterned to form openings 162 and 164.

Figure 1G:
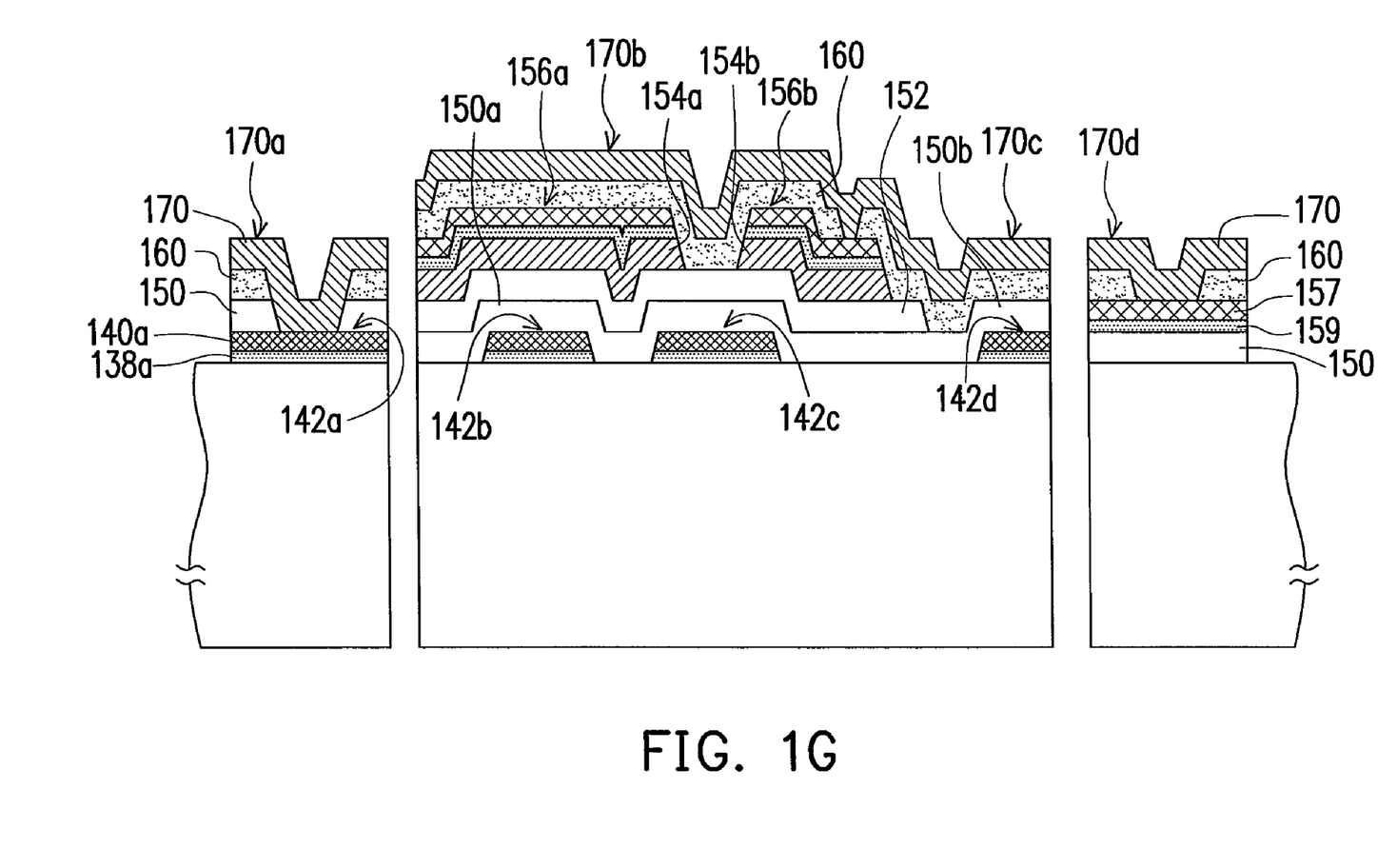

Thereafter, in FIG. 1G, a conductive layer 170 is formed over the substrate 100. The conductive layer 170 covering the scan line terminal 142a is used as a contact part 170a. The conductive layer 170 covering the gate conductive layers 142b and 142c is used as a portion of a pixel electrode 170b. The conductive layer 170 covering the electrode 142d is used as another electrode 170c of the storage capacitor. The conductive layer 170 covering the data line terminal 156c is used as a contact part 170d. The material of the conductive layer 170 comprises indium tin oxide (ITO), for example.

Experiment

Etchants having different concentration of peracetic acid: 5% by weight of the etchant, 15% by weight of the echant and 39% by weight of the etchant, are used to etch the composite layer containing copper and molybdenum in the experiment. The results show: after etching, the taper angle of the composite layer falls within the range of 45° to 75°; the critical dimension loss is less than 2 micrometers (μm); and no residues. Furthermore, the etch rate may reach 1500 angstroms/minute and the uniformity may reach 10%.

The etchant of the present invention may achieve the etching of a composite layer in one single step, curtailing the process time. Moreover, the concentration of the etchant may be effectively controlled, facilitating the precise formation of the desired shape such as a trapezoid. In addition, using the etchant of the present invention eliminates the Galvanic effect, and will not cause damages to the machines or pose occupational hazards.

Although the present invention has been disclosed above by the preferred embodiments, they are not intended to limit the present invention. Anybody skilled in the art may make some modifications and alteration without departing from the spirit and the scope of the present invention. Therefore, the protecting range of the present invention falls in the appended claims.

What is claimed is:

1. A method for fabricating a thin film transistor, comprising:

forming a first conductive layer on a substrate, wherein the first conductive layer is a composite layer or a single metal layer;

performing a first etching process to pattern the first conductive layer so as to form a gate;

forming a dielectric layer to cover the gate;

forming a channel layer on the dielectric layer;

forming a second conductive layer on the channel layer, wherein the second conductive layer is a composite layer or a single metal layer; and performing a second etching process to pattern the second conductive layer so as to form a source and a drain, wherein an etchant used in both of the first etching process and the second etching process comprises peracetic acid, a peracetic acid stabilizer, an organic acid, an inorganic acid, a salt and water.

2. The method according to claim 1, wherein the organic acid comprises a chemical selected from the group consisting of acetic acid, citric acid, oxalic acid, tartaric acid and a mixture comprising one or more of these chemicals.

3. The method according to claim 1, wherein the inorganic acid comprises a chemical selected from the group consisting of sulfuric acid (H$_2$SO$_4$), nitric acid (HNO$_3$), hydrochloric acid (HCl), phosphoric acid (H$_3$PO$_4$) and a mixture comprising one or more of these chemicals.

4. The method according to claim 1, wherein the salt comprises a chemical selected from the group consisting of KCl, NaCl, KHSO$_4$, KIO$_4$, (NH$_4$)HPO$_4$, CH$_3$COONH$_4$, CH$_3$COONa, CH$_3$COOK and a mixture comprising one or more of these chemicals.

5. The method according to claim 1, wherein the composite layer of the first and second conductive layers comprises a first metal layer and a second metal layer, the material of the first metal layer comprises copper or copper alloy, the second metal layer comprises one material selected from the group consisting of molybdenum, silver, tantalum, titanium, aluminium, chromium, nickel, tungsten, gold and a alloy comprising one or more of these materials; the single metal layer is a copper alloy layer and the element in the copper alloy layer is selected from the group consisting of magnesium, silver, chromium, tungsten, molybdenum, niobium, nitrogen, silver, ruthenium, carbon and a alloy comprising one or more of these elements.

6. The method according to claim 5, wherein the composite layer of the first and second conductive layers comprises a structure of the first metal layer/the second metal layer or a structure of the second metal layer/the first metal layer/the second metal layer structure.

7. The method according to claim 5, wherein the method for forming the composite layer and the single metal layer of the first and second conductive layers includes a sputtering process, an evaporation process, an electroplating process or an electroless plating process.

* * * * *